United States Patent
Zhang et al.

(10) Patent No.: US 9,934,949 B2
(45) Date of Patent: *Apr. 3, 2018

(54) SPUTTERING TARGET AND PRODUCTION METHOD OF THE SAME

(71) Applicant: MITSUBISHI MATERIALS CORPORATION, Tokyo (JP)

(72) Inventors: Shoubin Zhang, Sanda (JP); Keita Umemoto, Sanda (JP); Masahiro Shoji, Sanda (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/784,375

(22) PCT Filed: Apr. 10, 2014

(86) PCT No.: PCT/JP2014/060405
§ 371 (c)(1),
(2) Date: Oct. 14, 2015

(87) PCT Pub. No.: WO2014/171392
PCT Pub. Date: Oct. 23, 2014

(65) Prior Publication Data
US 2016/0079044 A1    Mar. 17, 2016

(30) Foreign Application Priority Data
Apr. 15, 2013 (JP) .................. 2013-084660
Mar. 18, 2014 (JP) .................. 2014-054655

(51) Int. Cl.
*C23C 14/00* (2006.01)
*H01J 37/34* (2006.01)
(Continued)

(52) U.S. Cl.
CPC ............ *H01J 37/3426* (2013.01); *B22F 3/10* (2013.01); *C22C 9/00* (2013.01); *C22C 28/00* (2013.01);
(Continued)

(58) Field of Classification Search
CPC .......................... C23C 14/06; C23C 14/0623
(Continued)

(56) References Cited

U.S. PATENT DOCUMENTS 6,261,984 B1 * 7/2001 Mochizuki .......... C23C 14/3414
501/133
6,669,830 B1 * 12/2003 Inoue ...................... C04B 35/01
204/298.13
(Continued)

FOREIGN PATENT DOCUMENTS

CN    101906552 A    12/2010
CN    102395702 A    3/2012
(Continued)

OTHER PUBLICATIONS

Shogo Ishizuka et al., "Recent Developments in Chalcopyrite Solar Cell and Module Technologies," Journal of the Vacuum Society of Japan, vol. 53, No. 1, 2010, pp. 25-29 and partial translation/English abstract thereof.
(Continued)

*Primary Examiner* — Timon Wanga
(74) *Attorney, Agent, or Firm* — Locke Lord LLP

(57) ABSTRACT

A sputtering target consists of a sintered body having a component composition consisting of: Ga of 10 to 40 at. % and Na of 0.1 to 15 at. % as metal elements; and the balance being Cu and inevitable impurities. The sintered body contains the Na in a form of Na compounds consisting of at least one compound selected from the group consisting of sodium sulfate, sodium sulfite, sodium selenate, and sodium sel-
(Continued)

enite, the sintered body has a composition in which a Na compound phase is dispersed, and an average grain size of the Na compound phase is 10 μm or less.

7 Claims, 3 Drawing Sheets

(51) Int. Cl.
  C22C 9/00       (2006.01)
  C23C 14/06      (2006.01)
  C23C 14/34      (2006.01)
  C22C 28/00      (2006.01)
  B22F 3/10       (2006.01)

(52) U.S. Cl.
  CPC ...... *C23C 14/0623* (2013.01); *C23C 14/3414* (2013.01); *B22F 2201/10* (2013.01); *B22F 2201/20* (2013.01); *H01J 2237/3321* (2013.01)

(58) Field of Classification Search
  USPC .......................................................... 501/133
  See application file for complete search history.

(56)         References Cited

U.S. PATENT DOCUMENTS

| | | | |
|---|---|---|---|
| 7,935,558 | B1 | 5/2011 | Juliano et al. |
| 8,048,707 | B1 | 11/2011 | Shufflebotham et al. |
| 8,795,489 | B2 | 8/2014 | Zhang et al. |
| 8,968,491 | B2 | 3/2015 | Zhang et al. |
| 2010/0116341 | A1 | 5/2010 | Huang et al. |
| 2011/0089030 | A1 | 4/2011 | Juliano et al. |
| 2012/0045360 | A1 | 2/2012 | Matsumura et al. |
| 2012/0090671 | A1 | 4/2012 | Shufflebotham et al. |
| 2012/0094429 | A1* | 4/2012 | Juliano ............... C23C 14/0623 438/95 |
| 2012/0217157 | A1 | 8/2012 | Zhang et al. |
| 2012/0258562 | A1 | 10/2012 | Hakuma et al. |
| 2013/0001078 | A1* | 1/2013 | Zhang ...................... C22C 1/10 204/298.13 |
| 2015/0014156 | A1* | 1/2015 | Zhang ...................... C23C 14/08 204/298.13 |

FOREIGN PATENT DOCUMENTS

| | | |
|---|---|---|
| EP | 2420590 A1 | 2/2012 |
| JP | 3249408 B2 | 1/2002 |
| JP | 2007-266626 A | 10/2007 |
| JP | 2007-302909 A | 11/2007 |
| JP | 2008138232 A | 6/2008 |
| JP | 2009-049389 A | 3/2009 |
| JP | 2010265544 A | 11/2010 |
| JP | 2011-074418 A | 4/2011 |
| JP | 2011-117077 A | 6/2011 |
| JP | 2011149039 A | 8/2011 |
| JP | 2012149039 A | 8/2011 |
| JP | 2011-214140 A | 10/2011 |
| JP | 2011214140 A | 10/2011 |
| JP | 4811660 82 | 11/2011 |
| JP | 4811660 B2 | 11/2011 |
| JP | 2012-082498 A | 4/2012 |
| JP | 2012193423 A | 10/2012 |
| JP | 2013-199704 A | 10/2013 |
| JP | 2014-034703 A | 2/2014 |
| TW | 201109458 A | 3/2011 |
| TW | 201126003 A | 8/2011 |
| TW | 201126003 A | 8/2011 |
| TW | 201127971 A | 8/2011 |
| TW | 201139702 A | 11/2011 |
| WO | 2009142316 A1 | 11/2009 |
| WO | 2011010529 A1 | 1/2011 |
| WO | 2011055537 A1 | 5/2011 |
| WO | 2011074685 A1 | 6/2011 |
| WO | 2011083647 A1 | 7/2011 |
| WO | 2011114657 A1 | 9/2011 |
| WO | WO 2011/114657 * 9/2011 ............. C23C 14/34 |
| WO | 2012005098 A1 | 1/2012 |
| WO | 2012147985 A1 | 11/2012 |
| WO | 2013077431 A1 | 5/2013 |

OTHER PUBLICATIONS

Shogo Ishizukaet al., "Na-induced variations in the structural, optical, and electrical properties of Cu(In,Ga)Se$_2$ thin films," Journal of Applied Physics 106, 2009, pp. 034908-1 to 034908-6.
D. Rudmann et al., "Effects of NaF coevaporation on structural properties of Cu(In,Ga)Se$_2$ thin films," Thin Solid Films, 431-432, 2003, pp. 37-40.
International Search Report dated Jul. 15, 2014, issued for PCT/JP2014/060405 and English translation thereof.
Office Action dated Jun. 27, 2016, issued for the Taiwanese Patent Application No. 102128116 and English translation of Search Report.
Office Action dated Mar. 16, 2016, issued for the Japanese patent application No. 2012-178888 and English translation thereof.
S. Ishizuka et al., "Recent Developments in Chalcopyrite Solar Cell and Module Technologies," Journal of the Vacuum Society of Japan, vol. 53, No. 1, 2010, pp. 25-29 and partial translation thereof.
S. Ishizuka, et al., "Na-induced variations in the structural, optical and electrical properties of Cu(In,Ga)Se2 thin films," Journal of Applied Physics 106, 2009, pp. 034908-1 to 034908-6.
Karin Granath, et al., "The effect of NaF on Cu (In,Ga) Se2 thin film solar cells," Solar Energy Materials & Solar Cells, vol. 60, 2000, pp. 279-293.
D. Rudman, et al. "Sodium incorporation strategies for CIGS growth at different temperatures," Thin Solid Films, vol. 480-481, 2005, pp. 55-60.
International Search Report dated Nov. 19, 2013, issued for PCT/JP2013/071516 and English translation thereof.
Supplementary European Search Report dated Oct. 12, 2015, issued for the European patent Application No. 13752289.2.
Notice of Refusal for Taiwan Patent Application No. 102106207 dated Feb. 13, 2015.
International Search Report dated Dec. 10, 2013, issued for PCT/JP2013/078067 and English translation thereof.
International Search Report of PCT/JP2013/054637 dated May 7, 2013.
Tanaka Tooru et al. "Characterization of Cu (InxGa1-x)2Se3.5 thin films prepared by rf sputtering", Solar Energy Materials and Solar Cells, 1998, col. 50, pp. 13-18.
Tanaka Tooru, et al. "Preparation of Cu(In,Ga)2Se3.5 thin films by radio frequency sputtering from stoichiometric Cu (In,Ga)Se2 and Na2Se mixture target", J. Appl. Phys. vol. 81, No. 11, 1997, pp. 7619-7622.
Office Action dated Mar. 8, 2016, Issued for the Chinese patent application No. 201380053585.7 and English translation thereof.
A. Romeo et al., "Development of Thin-film Cu(In,Ga) Se2 and CdTe Solar Cells", Prog. Photovolt: Res. Appl. 2004; 12, pp. 93-111.
International Search Report dated Dec. 10, 2013, issued for PCT/JP2013/078067 and English translation thereof.
Tanaka Tooru, et al. "Preparation of Cu(In,Ga)2Se3.5 thin films by radio frequency sputtering from stoichiometric Cu(In,Ga)Se2 and Na2Se mixture target", J. Appl. Phys. vol. 81, No. 11, 1997, pp. 7619-7622.
Office Action dated Dec. 10, 2015 for U.S. Appl. No. 14/380,610.

\* cited by examiner

SPUTTERING TARGET AND PRODUCTION METHOD OF THE SAME

TECHNICAL FIELD

The present invention relates to a sputtering target for use in forming Cu—In—Ga—Se compound film (hereinafter, referred to as "CIGS film") for forming a light absorbing layer of a thin-film type solar battery, and a production method thereof.

Priority is claimed on Japanese Patent Application No. 2013-084660, filed Apr. 15, 2013, and Japanese Patent Application No. 2014-054655, filed Mar. 18, 2014, the contents of which are incorporated herein by reference.

BACKGROUND ART

In recent years, thin-film type solar cells produced by using a chalcopyrite compound semiconductor have been employed, the thin-film type solar cells produced by using the compound semiconductor have a basic structure in which an Mo electrode layer that is used as a positive electrode is formed on a soda-lime glass substrate, a light absorbing layer consisting of a CIGS film is formed on the Mo electrode layer, a buffer layer consisting of zinc sulfide (ZnS), cadmium sulfide (CdS), and the like is formed on the light absorbing layer, and a transparent electrode layer that is used as a negative electrode is formed on the buffer layer.

As a method for forming the light absorbing layer described above, a vapor deposition film-forming method is known. Although a light absorbing layer obtained by the method may exhibit high energy conversion efficiency, the vapor deposition film-forming method attains slow speed for forming a film. Hence, when a film is formed on a substrate having a large area, the uniformity of the thickness distribution of the film thickness is readily reduced. Thus, a sputtering method for forming a light absorbing layer has been proposed.

As a method for forming the light absorbing layer described above, a method (selenization method) has been proposed in which an In film is formed by sputtering using an In target in the beginning, a Cu—Ga binary-based alloy film is formed on the In film by sputtering using a Cu—Ga binary-based alloy target, and a stacked precursor film consisting of the obtained In film and Cu—Ga binary-based alloy film is subjected to heat treatment in a Selenium atmosphere and thereby a CIGS film is formed.

In order to improve an electric generation efficiency of the light absorbing layer formed of the CIGS film, for example as shown in Non-Patent document 1, an addition of Na into the light absorbing layer by the diffusion from an alkaline glass substrate is effective. However, there is an inconvenience in that in a case of a flexible CIGS solar battery in which a polymer film or the like instead of the alkaline glass substrate is a base material, a supply source of Na is lost because there is no alkaline glass substrate.

Accordingly, it has been proposed that a lift-off layer by sodium chloride (NaCl) is provided and Na is diffused into the light absorbing layer from the lift-off layer in order to improve photoelectric conversion properties of the flexible CIGS solar battery formed on the polymer film (for example, refer to Patent Document 1).

With respect to the addition of Na, a method has been proposed in which a soda-lime glass is formed between a Mo electrode layer and a substrate (for example, refer to Non-Patent Documents 1 and 2). However, when the soda-lime glass is deposited by the proposed method, the producing processes increase and the productivity is reduced.

There is a proposal that fluoride sodium (NaF) is added into a Mo electrode layer and Na is diffused into the light absorbing layer from the Mo electrode layer (for example, refer to Patent Document 2). However, when NaF is added into the Mo electrode layer, a large amount of Na is concentrated between the Mo electrode layer and a substrate, and there is a possibility of the occurrence of peeling off at an interface between the Mo electrode layer and the substrate.

Also, since the amount of diffusion of Na from the glass substrate or the like is difficult to control, as a method for adding Na regardless of diffusion, a method that a specific Na compound is directly added into the light absorbing layer has been proposed. For example, it is proposed that a diffusion blocking layer is provided between the glass substrate and the absorbing layer and the diffusion of Na from the glass substrate is blocked, and sulfide sodium ($Na_2S$) and selenide sodium ($Na_2Se$) are added into the light absorbing layer and the content of Na with respect to the light absorbing layer is controlled (for example, refer to Patent Document 3).

In order to add a specific Na compound directly into the light absorbing layer, a Cu—Ga sputtering target containing Na of 0.05 to 1 at. % and containing Na in a state of NaF compound has been proposed (for example, refer to Patent Document 4).

Here, for example in Non-Patent Document 3, a CIGS film in which the addition of Na is 2% is disclosed, and it is known that a CIGS solar battery having a good electrical efficiency can be obtained with a high concentration of Na addition that is not studied conventionally.

Also, fluoride sodium (NaF), chloride sodium (NaCl), sulfide sodium (NaS), selenide sodium ($Na_2Se$), sodium sulfate ($Na_2SO_4$) and sodium sulfite ($Na_2SO_3$), selenium sodium ($Na_2SeO_4$) and sodium selenite ($Na_2SeO_3$), or the like, is proposed as Na compounds that is added in a sputtering target consisting of copper, indium, and gallium (for example, refer to Patent Documents 5 and 6).

PRIOR ART DOCUMENTS

Patent Documents

[Patent Document 1] Japanese Unexamined Patent Application, First Publication No. 2009-49389
[Patent Document 2] Japanese Unexamined Patent Application, First Publication No. 2011-74418
[Patent Document 3] Japanese Unexamined Patent Application, First Publication No. 2007-266626
[Patent Document 4] Japanese Unexamined Patent Application, First Publication No. 2011-117077
[Patent Document 5] U.S. Pat. No. 7,935,558 Specification
[Patent Document 6] U.S. Unexamined Patent Application Publication No. 2012/0258562

Non-Patent Document

[Non-Patent Document 1] Ishizuka et al., "Current situation of development of Chalcopyrite-based thin-film solar battery and future perspective thereof" Journal of the Vacuum Society of Japan, Vol 53, No. 1 2010 p. 25
[Non-Patent Document 2] Ishizuka et al., "Na-induced variations in the structural, optical, and electrical properties of $Cu(In,Ga)Se_2$ thin films", JOURNAL OF APPLIED PHYSICS 106, 034908_2009

[Non-Patent Document 3] D. Rudmann et al., "Effect of NaF coevaporation on structural properties of Cu(In,Ga)Se$_2$ thin films", Thin Solid Films 431-432(2003)37-40

DISCLOSURE OF THE INVENTION

Problems to be Solved by the Invention

The following problems remain in the above proposed prior art.

In a case of producing a sputtering target in which Na compounds are added as proposed above, when sodium sulfate and sodium sulfite, or sodium selenate and sodium selenite are added, a discoloration occurs in the sputtering target, and furthermore, it was found that problems such as the abnormal discharge easily occurring during sputtering occur frequently.

In general, sodium compound easily adsorbs moisture in the environment. Therefore, when sodium compounds are added in a sputtering target, a lot of discoloration and spots on the surface thereof is ease to occur. Furthermore, the solar battery produced by using the sputtering target in which the Na compounds are added, there is an inconvenience in that the characteristics of the solar battery become significantly unstable. In particular, sodium sulfate, sodium sulfite, sodium selenate and sodium selenite have a high water-absorbing property, and therefore, the above problem becomes noticeable. In addition, in the above Patent Documents 5 and 6, there only discloses the addition of Na compounds in the sputtering target, the particle size of the Na compounds and the like are not mentioned when the addition of Na compounds is performed, and moreover, there is no suggestion of it.

Also, according to the addition of sodium sulfate, sodium sulfite, sodium selenate and sodium selenite, there is an inconvenience in that a frequent abnormal discharge occurs during sputtering, and furthermore, a mechanical strength of the sputtering target lowers and the sputtering target is ease to crack. That is, according to a large amount of the addition of sodium compounds which have no conductivity, and which is difficult to be sintered and is low in mechanical strength, the mechanical strength of the sputtering target lowers, a generation rate of defects during machining is increased, and furthermore, abnormal discharge caused by sodium compounds easily occurs during sputtering.

The present invention has been made in view of the above problems, and the object thereof is to provide a sputtering target in which an occurrence of discoloration and spots is reduced and abnormal discharge is suppressed even though the sputtering target contains Na and furthermore to provide the sputtering target which has a high strength and is hard to crack, and to provide the production method thereof.

Means for Solving the Problem

The inventors of the present invention have conducted research to achieve the addition of Na of 0.1 to 15 at. % in a Cu—Ga alloy sputtering target having Ga concentration of 10 to 40 at. %. As a result, the inventors have found that the above problems can be overcome along with the addition of Na to a sputtering target by the selection of a raw material, an improvement of the production method, and the like.

The present invention is obtained by the above findings, and in order to solve the problems, the present invention adopts the following configurations.

(1) An aspect of the present invention provides a sputtering target that consists of a sintered body having a component composition consisting of: Ga of 10 to 40 at. % and Na of 0.1 to 15 at. % as metal elements; and the balance being Cu and inevitable impurities. The sintered body contains the Na in a form of Na compounds consisting of at least one compound selected from the group consisting of sodium sulfate, sodium sulfite, sodium selenate, and sodium selenite, the sintered body has a composition in which a Na compound phase is dispersed, and an average grain size of the Na compound phase is 10.0 μm or less.

(2) In the sputtering target according to (1), in the sintered body, the average number of Na compound aggregates having the size of 0.05 mm$^2$ or more within an area of 1 cm$^2$ of a surface of the sputtering target is one or less.

(3) In the sputtering target according to (1) or (2), the sintered body has a theoretical density ratio of 90% or more, a deflective strength of 100 N/mm$^2$ or more, and a bulk resistivity of 1 mΩ·cm or less.

(4) In the sputtering target according to any one of (1) to (3), a metallic phase in the sintered body has an average crystal grain size of 20 μm or less.

(5) Another aspect of the present invention provides a production method of the sputtering target including the steps of: preparing a mixed powder in which a Na compound powder and a Cu—Ga powder are mixed, the Na compound powder consisting of at least one compound selected from the group consisting of sodium sulfate, sodium sulfite, sodium selenate, and sodium selenite; and producing a sintered body by sintering the mixed powder. The Cu—Ga powder consists of a Cu—Ga alloy powder or consists of a Cu—Ga alloy powder and a Cu powder, the average particle size thereof is 1 to 45 μm, and the particle having the particle size of 30 μm or less is account for 50 wt. % or more compared to the total powder weight of the Cu—Ga powder.

(6) The production method according to (5) further includes the step of drying the Na compound powder at a temperature of 70° C. or more before the step of preparing the mixed powder.

(7) The production method according to (5) or (6) further includes the step of drying the mixed powder at a temperature of 70° C. or more after the step of preparing the mixed powder.

(8) In the production method according to any one of (5) to (7), the step of sintering the mixed powder performs sintering of the mixed powder in a non-oxidizing atmosphere or vacuum.

As described above, the sputtering target according to the present invention has a component composition consisting of: Ga of 10 to 40 at. % and Na of 0.1 to 15 at. % as metal elements of the sputtering target; and the balance being Cu and inevitable impurities, the Na in the sputtering target is contained in a form of Na compounds (hereinafter described as a specific Na compounds) consisting of at least one compound selected from the group consisting of sodium sulfate, sodium sulfite, sodium selenate, and sodium selenite; the sputtering target has the theoretical density ratio of 90% or more, a deflective strength of 100 N/mm$^2$ or more, and a bulk resistivity of 1 mΩ·cm or less; and the average number of Na compound aggregates having the size of 0.05 mm$^2$ or more within an area of 1 cm$^2$ of a surface of the sputtering target is one or less.

By securing sufficiently the density of the target, securing the deflective strength and electrical resistance, and suppressing the aggregates described above, a sputtering target in which the occurrence of discoloration and spots and abnormal discharge are suppressed even though a high concentration of Na is contained can be obtained, and furthermore the sputtering target which has a high strength and is hard to crack can be obtained.

In addition, the content of Na and the content of Ga in the present invention are the contents with respect to the overall metal elements in the sputtering target, and as described below, each of the content of Na and the content of Ga is calculated by the ratio of Na and Ga to the total content of Cu, Ga, and Na atoms in the sputtering target.

Na (at. %): Na/(Na+Cu+Ga)×100%

Ga (at. %): Ga/(Na+Cu+Ga)×100%

The reason for setting the content of Na contained in the form of the specific Na compounds within the above ranges is because when the content of Na exceeds 15 at. %, the mechanical strength of the sputtering target is significantly reduced and a sufficient sintered density cannot be secured, and at the same time, abnormal discharge during sputtering increases. On the other hand, when the content of Na is less than 0.1 at. %, the content of Na in the film becomes insufficient and the purpose of the addition of Na cannot be achieved.

Also, the reason for setting the theoretical density ratio in the target to 90% or more is, when the theoretical density ratio is less than 90%, the number of pores that are present in the target and that are communicated with the ambient air of the outside of the sputtering target increases, the specific Na compounds contained in the inside of the target absorb moisture from the ambient air, and the discoloration of the target occurs during the manufacturing process, during storage, and during use.

On the other hand, in the sputtering target in which the density of a target material is high and which contains a large amount of the specific Na compounds, brittleness is more likely to increase. In contrast, in the present invention, the deflective strength of the target is 100 N/mm$^2$ or more, and the occurrence of cracks during machining in the production of the target and sputtering is prevented.

Furthermore, when the specific Na compounds having no conductivity are added to the sputtering target, abnormal discharge during sputtering is likely to occur, but in the present invention, a bulk resistivity of the sputtering target is 1 mΩ·cm or less and thereby abnormal discharge is prevented.

Furthermore, when the specific Na compounds are added to the sputtering target, the aggregates of the specific Na compounds having the size of 0.05 mm$^2$ or more (hereinafter, also called specific Na compound aggregates) easily absorb moisture in particular because their contact area with ambient air is large, and it was found that the aggregates thereof are the main cause of the occurrence of discoloration and spots of the surface of the sputtering target. The discoloration and spots caused by the specific Na compound aggregates that are generated on the target surface and that have the size of 0.05 mm$^2$ or more cannot remove by press sputtering which is generally performed in the beginning of use of a sputtering target. As a result, impurities (hydrogen and oxygen in which moisture is absorbed) are contaminated in a deposited film. Moreover, a release of adsorbed moisture by the specific Na compound aggregates during sputtering leads to a local concentration of plasma, significant abnormal discharge occurs around the spots due to the aggregates, the Na compounds originally having a high vapor pressure is evaporated by a high temperature provided by this abnormal discharge, and additionally, an abnormal discharge trace having a cavity shape is formed in the vicinity of spots portion by attracting the plasma.

The surface condition of the sputtering target in which such significant abnormal discharge occurs is significantly destroyed, and the sputtering target falls into a state that is unable to use for sputtering in the number of the abnormal discharges of one time or several times. Such things become particularly noticeable in a sputtering target containing the specific Na compounds. Therefore, the present invention implemented measures in which the average number of the specific Na compound aggregates having the size of 0.05 mm$^2$ or more within an area of 1 cm$^2$ of the target surface is limited to one or less, and thereby, the occurrence of discoloration and spots is suppressed, and impurities contamination in the film, reduction of mechanical strength of the sputtering target and the occurrence of abnormal discharge during sputtering caused by the occurrence thereof are prevented.

The sputtering target according to the present invention is preferable to have a structure in which a specific Na compound phase is dispersed in a target basis material and an average grain size of the specific Na compound phase is 10.0 μm or less. Here, the average grain size is a circle-equivalent diameter of a projected area.

Since the specific Na compounds contained in the sputtering target are an insulating material, the dispersion of the specific Na compound phase is difficult in a usual production method when a large amount of the above compound is included therein. In the sputtering target of the present invention, a significant abnormal discharge such that a cavity shaped discharge trace is formed on the target surface can be prevented by limiting the average number of the specific Na compound aggregates having the size of 0.05 mm$^2$ or more within an area of 1 cm$^2$ of the target surface to one or less. However, in the target material, in a case where micro dispersion of the specific Na compound phase is not performed properly, when direct-current (DC) sputtering is performed, an abnormal discharge called a micro arc easily occurs. The micro arc, depending on its extent, does not cause a large amount of damage to the sputtering target, but it may cause bad effects to a film quality of the obtained film. Here, it has found that the micro-arc-abnormal discharge caused by the specific Na compounds can be significantly reduced when the average grain size of the specific Na compounds is 10.0 μm or less. Furthermore, the specific Na compounds located at a surface layer are inevitable to be in contact with ambient air, and when the average grain size thereof exceeds 10.0 μm, the amount of moisture absorption increases and it causes discoloration of the target surface.

In addition, in the sputtering target described in Patent Documents 5 and 6, Na compounds are added; however, the above documents do not mention the particle diameters or the like of the Na compounds and moreover have no suggestion thereof. In contrast, in the sputtering target of the present invention, the average grain size related to the Na compounds which were added is important to form in the size of 10.0 μm or less for preventing the discoloration of the target surface and the micro-arc abnormal discharge.

In consideration of the above, the sputtering target of the present invention enables a high-speed deposition under a condition of a DC sputtering or pulse-DC sputtering by optimizing a grain size of the specific Na compound phase as described above. That is, in the sputtering target of the present invention, the discoloration of the target surface is suppressed in minimum by forming the average grain size of each specific Na compound phase to 10.0 μm or less, and furthermore, a stable DC sputtering or pulse-DC sputtering becomes possible by suppressing the micro-arc-abnormal discharge caused by the specific Na compounds.

An average grain size of the metallic phase in the target basis material according to the sputtering target of the present invention is preferable to be 20 µm or less.

In this sputtering target, since the average grain size of the metallic phase in the target basis material is 20 µm or less, even though the theoretical density ratio is 90% or more and the specific Na compounds are contained, toughness of the target material can be satisfactory maintained That is, as described above, in order to minimize the moisture adsorption of the target material, the theoretical density ratio of the target material is required to set to 90% or more; however, by improving the density of the target, brittleness of the target material is more likely to increase in the sputtering target of the present invention containing a large amount of the specific Na compounds. Therefore, forming the average crystal grain size of the metallic phase to 20 µm or less is effective for maintaining the toughness of the target material. In addition, when the average grain size exceeds 20 µm, defects easily appear during machining of the target material.

A production method of the sputtering target of the present invention includes the steps of: preparing a mixed powder in which a specific Na compound powder and a Cu—Ga powder are mixed; and producing a sintered body of the target material by sintering the mixed powder. The Cu—Ga powder consists of a Cu—Ga alloy powder or consists of a Cu—Ga alloy powder and a Cu powder, an average particle size thereof is 1 to 45 µm, and the particle having the particle size of 30 µm or less is account for 50 wt. % or more compared to the total powder weight of the Cu—Ga powder.

In this production method of the sputtering target, since the average particle size of the Cu—Ga powder is 1 to 45 µm and moreover the particle having the particle size of 30 µm or less is account for 50 wt. % or more compared to the total powder weight of the Cu—Ga powder, it is possible to produce a sputtering target in which the occurrence of discoloration and spots and abnormal discharge are suppressed even though the sputtering target contains Na, and furthermore, it is possible to produce the sputtering target which has a high strength and is hard to crack.

When a fine metal powder and a fine specific Na compound powder are mixed in the step of adding the Na compounds, a network of metal powder cannot be formed, conversely. The mechanical strength of the obtained target is reduced and also there is a case where conductivity is reduced, and therefore, the average particle size of the Cu—Ga powder was set to 1 µm or more.

On the other hand, when the particle size of the Cu—Ga powder is too large, the dispersion of the specific Na compounds becomes insufficient, and additionally, large aggregates of the specific Na compounds are likely to be formed. The formation of this large aggregates causes of the discoloration, reduction of the mechanical strength, and abnormal discharge. Also, in the sputtering target produced by using a Cu—Ga powder having a large particle size, the specific Na compounds are likely to concentrate at a grain boundary of the metallic phase. This also causes the discoloration in the sputtering target, reduction of the mechanical strength, and abnormal discharge. In contrast to this, in the present invention, the average particle size of the Cu—Ga powder is set to 45 µm or less and the particle having the particle size of 30 µm or less is account for 50 wt. % or more compared to the total powder weight of the Cu—Ga powder; and thereby, the particle size distribution becomes in a proper range, and the discoloration in the sputtering target, reduction of the mechanical strength, and abnormal discharge can be prevented. In addition, it is preferable to have an average grain size of 10 to 40 µm in order to reduce the content of oxygen of the Cu—Ga alloy powder.

The production method of the sputtering target of the present invention is preferable to include the step of drying the specific Na compound powder at a temperature of 70° C. or more before the step of preparing the mixed powder.

Also, the production method of the sputtering target of the present invention is preferable to include the step of drying the mixed powder at a temperature of 70° C. or more after the step of preparing the mixed powder.

Since these production methods of the sputtering target have the step of drying the specific Na compound powder at a temperature of 70° C. or more before the mixed powder is prepared, and then drying the mixed powder at a temperature of 70° C. or more, the dispersion of the grains of the specific Na compounds is conducted, and a re-aggregation after mixing of the raw material powders can be suppressed. In addition, before the step of preparing the mixed powder is carried out, when the re-aggregation after mixing can be sufficiently suppressed by carrying out only the step of drying the specific Na compound powder, the step of drying that is the step after the step of preparing the mixed powder can be omitted.

The production method of the sputtering target of the present invention performs sintering of the mixed powder in a non-oxidizing atmosphere or vacuum, in the step of sintering the mixed powder.

That is, in this production method of the sputtering target, since the mixed powder is sintered in a non-oxidizing atmosphere or vacuum, the content of oxygen can be further reduced.

Effects of the Invention

The present invention has the following effects.

That is, according to the sputtering target related to the present invention and a production method thereof, Na is contained in a form of the specific Na compounds, the theoretical density ratio of the target material is 90% or more, the deflective strength of the target material is 100 N/mm$^2$ or more, the bulk resistivity of the target material is 1 mΩ·cm or less, and the average number of the specific Na compound aggregates having the size of 0.05 mm$^2$ or more within an area of 1 cm$^2$ of the target surface is one or less. Therefore, the discoloration caused by moisture adsorption and abnormal discharge are suppressed even though the sputtering target contains Na, and furthermore, the sputtering target has a high strength and is hard to crack. Thus, the deposition of a light absorbing layer of a CIGS thin-film type solar battery by the sputtering method that uses the sputtering target of the present invention can achieve the addition of Na to the light absorbing layer along with providing a high mass-productivity and can produce a solar battery having high power generation efficiency.

EMBODIMENTS OF THE INVENTION

Figure 1:
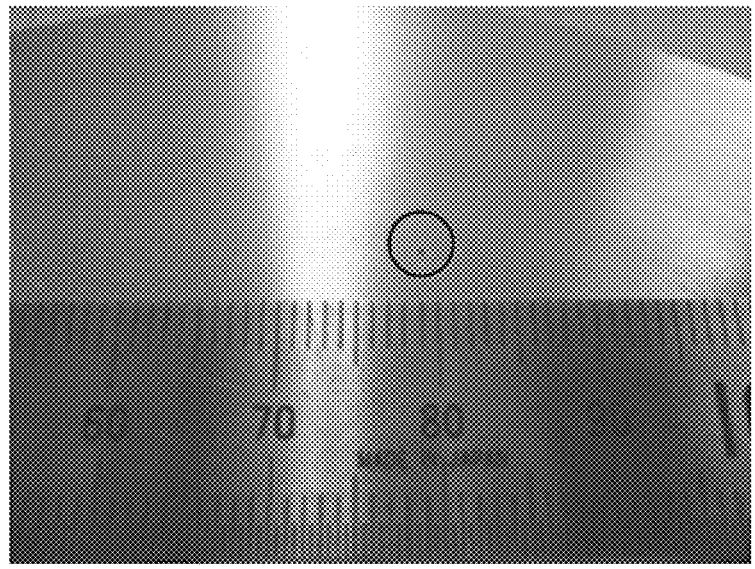
FIG. 1 is a picture of a light microscope showing aggregates of a target surface in the sputtering target of an Example.

Hereinafter, an embodiment of a sputtering target related to the present invention and a production method thereof will be described with examples being provided.

The sputtering target of the present embodiment has a component composition consisting of: Ga of 10 to 40 at. % and Na of 0.1 to 15 at. % as metal elements of the sputtering target; and the balance being Cu and inevitable impurities, contains the Na in a form of specific Na compounds consisting of at least one compound selected from the group consisting of sodium sulfate ($Na_2SO_4$), sodium sulfite ($Na_2SO_3$), sodium selenate ($Na_2SeO_4$), and sodium selenite ($Na_2SeO_3$); has the theoretical density ratio of 90% or more, a deflective strength of 100 N/mm$^2$ or more, and a bulk resistivity of 1 mΩ·cm or less. The average number of Na compound aggregates of the sputtering target of the present embodiment is one or less, the Na compound aggregates having the size of 0.05 mm$^2$ or more within an area of 1 cm$^2$ of a surface of the sputtering target.

The sputtering target according to the present embodiment has a structure in which a specific Na compound phase is dispersed in the target basis material and an average grain size of the specific Na compound phase is 10.0 μm or less, and an average grain size of a metallic phase in the target basis material is 20 μm or less.

A production method for producing the sputtering target of the embodiment shown above will be explained.

First, a Cu—Ga alloy powder (I) having Ga atom ratio of R1, a Cu—Ga alloy powder (II) having Ga atom ratio of R2, and a Cu powder (having purity of 4N) were prepared so as to have a component composition and particle size as shown in Table 1, and a specific Na compound powder having an average primary particle size of 1 μm, having purity of 3N (purity of 99.9%) and shown in Table 2 was prepared. The specific Na compounds were dried in the aforementioned predetermined vacuum environment. Then, the mixed powders of Examples 1 to 17 were prepared by weighing and compounding the powders as shown in Tables 1 and 2, and then mixing the powders. These mixed powders were put in a polyethylene pot having a volume of 10 L, and a zirconia ball having a diameter of 2 mm and dried at 80° C. for 10 hours was put in the pot, and the powders were mixed for the specified time by a ball mill. This mixing was carried out in a nitrogen atmosphere. In addition, the zirconia ball having a diameter of 2 mm is light in weight and therefore has the effects of dispersing and mixing without crushing the Cu powder and the Cu—Ga alloy powder. Also, when the weight ratio of ball-to-powder was "ball:powder=2:1", the best dispersion effects were obtained.

Then, each obtained mixed powder of the Examples 1 to 17 was sintered at the specified conditions given in Table 3 after it was sieved and further dried at the above described predetermined environment.

When sintering at atmospheric pressure, first, the mixed powder was filled into a metal mold and was pressed at room temperature at a pressure of 150 MPa, and a molded body was produced. The molded body was sintered in a mixed atmosphere of nitrogen and hydrogen of 3% and a sintered body of Examples 1 to 17 having a high density was obtained.

In a case of a hot pressing (HP), a vacuum hot pressing was carried out by filling the raw material powders to a graphite mold. In a case of a HIP (hot isostatic pressing) a molded body was produced in the same way as sintering at atmospheric pressure, and the molded body was charged in stainless steel container having a thickness of 0.5 mm, and then, the molded body was sealed by the step of a vacuum degassing, and the HIP processing was carried out.

The sintered body of each of the Examples 1 to 17 produced in the above way was subjected to dry cutting, and thereby, the sputtering target of each of the Examples 1 to 17 having 125 (mm) in diameter×5 (mm) in thickness was produced.

In order to compare with these Examples, as shown in Tables 1 to 3, the sputtering target of each of the Comparative Examples 1 to 14 which are under conditions deviating from the scope of the present invention was produced.

In addition, the results of the quantitative analysis of the content of Ga and Na with respect to the produced sputtering targets of the Examples 1 to 17 and the Comparative Examples 1 to 14 using ICP (inductively coupled plasma) method are shown in the column of "composition of sintered body (at. %)" in Table 3.

The use of the sputtering targets such as preparing the specific Na compound powder and mixed powder, sintering, and machining will be explained below.

<Specific Na Compound Powder>

The specific Na compound powder is preferable to have a purity of 3N or more and have a primary particle size of 0.01 to 1.0 μm.

In addition, it is preferable to remove the adsorbed moisture in the specific Na compounds by drying in the condition of 60 to 140° C. for 3 to 24 hours before mixing the powder. For example, it is effective to dry at 120° C. for 10 hours in a vacuum condition in a vacuum dryer.

In addition, since the specific Na compounds have high moisture adsorption properties and dissolves in water, it is not preferable to use a wet-type pulverizing-mixing device.

<Preparation of Mixed Powder>

In preparing a mixed powder of the specific Na compound powder and the Cu—Ga powder in the step of mixing, a crushing method using the pulverizing-mixing device (for example, a ball mill, jet mill, Henschel mixer, Attritor or the like) and different mixing methods of the following (1) to (3) can be utilized.

(1) A method in which crushing of the specific Na compound powder and mixing of the Cu—Ga powder thereto are performed separately.

An average secondary particle size of the specific Na compounds obtained by crushing is preferably 1 to 5 μm. The step of crushing is preferably performed under a drying environment having a humidity RH of 40% or less. As described above, the specific Na compound powder obtained by after such crushing is preferably dried at 70° C. or more before mixing it.

Then, this specific Na compound powder and the Cu—Ga powder prepared in a target composition are mixed under a drying environment having a relative humidity RH of 40% or less using a dry-mixing device, thereby making a mixed powder. In addition, the mixing is more preferably performed in a reducing atmosphere.

(2) A method in which crushing of the specific Na compound powder and mixing of the Cu—Ga powder thereto are performed at the same time.

A specific Na compound powder which has been already dried and the Cu—Ga powder prepared in a target composition are filled in the pulverizing-mixing device at the same time, and the crushing is stopped when the average secondary particle size of the specific Na compound powder becomes 5 μm or less. In addition, the mixing is preferably performed under a drying environment having a relative humidity RH of 40% or less and is more preferably performed in a reducing atmosphere.

(3) A method in which a plurality kinds of Cu—Ga alloy powder having different concentration of Ga is used.

First, a Cu—Ga alloy powder having larger content of Ga than the ratio of Cu/Ga of the target composition (hereinafter, so-called a high Ga powder), and either a Cu—Ga alloy powder having lower content of Ga than the ratio of Cu/Ga of the target composition or a Cu powder (hereinafter, so-called low Ga powder) are prepared.

The high Ga powder is mixed to the specific Na compound powder which has been already dried, then furthermore, the low Ga powder is added therein and mixed so as to be uniformed, and thereby a mixed powder is obtained. Here, the Ga atom ratio of the high Ga powder was defined as "R1=Ga/(Ga+Cu)", the Ga atom ratio of the low Ga powder was defined as "R2=Ga/(Ga+Cu)", and they were calculated from the content of Ga (at. %) and the content of Cu (at. %).

The above mixing is performed in a low humidity environment such as the above (1) and (2). In addition, it is more preferably performed in a reducing atmosphere.

In any of (1) to (3), it is effective to carry out the step of drying at 70 to 100° C. for 8 to 24 hours in a vacuum environment inside a vacuum dryer in order to remove the adsorbed moisture in the mixed powder after mixing.

Next, the raw material powders mixed with any of the above methods (1) to (3) are stored by sealing in a bag made of a plastic resin in the dry environment having a humidity RH of 30% or less. This step is carried out to prevent from the moisture adsorption of the specific Na compounds and the aggregation caused by moisture adsorption.

<Sintering Step>

In order to prevent oxidation during sintering of the Cu—Ga powder, the sintering is preferably carried out in a non-oxidizing reducing atmosphere, in a vacuum, or in an inert gas atmosphere.

As a method of sintering the mixed powder, for example, the following three methods can be applied.

Method 1: The mixed powder is filled into a mold, a compact body having a constant bulk density is formed by being filled in a shaped body which is cold-press-molded or a shaping mold and by tapping, and it is sintered in a vacuum, inert gas or a reducing atmosphere.

Method 2: The mixed powder is hot-pressed (HP) in a vacuum or inert gas atmosphere.

Method 3: The mixed powder is sintered using a hot isostatic pressing process (HIP) method.

<Machining or the Like>

Next, a Cu—Ga-specific Na compound-sintered body obtained by the above sintering step is machined to a specified shape by using a usual discharge machining, a cutting or grinding, thereby the sputtering target of the present embodiment is produced. At this time, since the specific Na compounds have properties of dissolving in water, during machining, a dry method which does not use a coolant or a wet method which uses a coolant that does not include water is preferable. Also, there is a method in which after pre-machining is carried out by the wet method, a precision machining of the surface is further carried out by dry method.

Next, the sputtering target after the above machining is bonded to a backing plate consisting of Cu, SUS (stainless steel), or other metal (e.g., Mo) using In as solder and it is subjected to sputtering.

In addition, when storing the sputtering target which has already machined, it is preferable to vacuum pack the entire sputtering target or pack the sputtering target using an inert gas replacement in order to prevent from oxidation and moisture adsorption of the target.

<Method of Using the Sputtering Target>

The sputtering target produced by the above is subjected to DC magnetron sputtering by using Ar gas as a sputtering gas. In this case, a pulsed DC power source for applying a pulse voltage is preferably used; however, depending on the content of the specific Na compounds, sputtering by a DC power source without pulses is also possible. Also, the input power during sputtering is preferably 1 to 10 W/cm².

TABLE 1

| | Cu—Ga powder (I) | | | Cu—Ga powder (II) | | | Cu powder | | Average particle size of Cu—Ga powder (μm) | Occupied percentage of particle of Cu—Ga powder having particle size of 30 μm or less (wt. %) |
|---|---|---|---|---|---|---|---|---|---|---|
| | Average particle size (μm) | Ga atom ratio R1 | Additive amount (g) | Average particle size (μm) | Ga atom ratio R2 | Additive amount (g) | Average particle size (μm) | Additive amount (g) | | |
| Example 1 | 28 | 0.40 | 6250 | — | — | — | — | — | 28 | 55 |
| Example 2 | 45 | 0.50 | 3100 | — | — | — | 1 | 3000 | 23 | 72 |
| Example 3 | 43 | 0.37 | 4400 | — | — | — | 5 | 1500 | 33 | 57 |
| Example 4 | 28 | 0.50 | 2100 | 20 | 0.40 | 3200 | — | — | 23 | 71 |
| Example 5 | 30 | 0.30 | 5250 | — | — | — | — | — | 30 | 62 |
| Example 6 | 27 | 0.18 | 3650 | — | — | — | 1 | 1500 | 20 | 62 |
| Example 7 | 29 | 0.40 | 5000 | — | — | — | — | — | 29 | 58 |
| Example 8 | 30 | 0.20 | 4550 | — | — | — | — | — | 30 | 51 |
| Example 9 | 22 | 0.40 | 3000 | 45 | 0.20 | 2000 | 1 | 1200 | 25 | 60 |
| Example 10 | 18 | 0.35 | 6100 | — | — | — | — | — | 18 | 81 |
| Example 11 | 35 | 0.30 | 3500 | — | — | — | 4 | 2000 | 24 | 63 |
| Example 12 | 28 | 0.40 | 5100 | — | — | — | — | — | 28 | 60 |
| Example 13 | 31 | 0.40 | 6350 | — | — | — | — | — | 31 | 50 |
| Example 14 | 11 | 0.15 | 4000 | 35 | 0.05 | 1950 | — | — | 19 | 85 |
| Example 15 | 21 | 0.30 | 5550 | — | — | — | — | — | 21 | 79 |
| Example 16 | 11 | 0.27 | 5000 | — | — | — | 3 | 2000 | 9 | 86 |

TABLE 1-continued

| | Cu—Ga powder (I) | | | Cu—Ga powder (II) | | | Cu powder | | Average particle size of Cu—Ga powder (μm) | Occupied percentage of particle of Cu—Ga powder having particle size of 30 μm or less (wt. %) |
|---|---|---|---|---|---|---|---|---|---|---|
| | Average particle size (μm) | Ga atom ratio R1 | Additive amount (g) | Average particle size (μm) | Ga atom ratio R2 | Additive amount (g) | Average particle size (μm) | Additive amount (g) | | |
| Example 17 | 26 | 0.40 | 4000 | — | — | — | 1 | 1900 | 18 | 62 |
| Comparative Example 1 | 50 | 0.40 | 6250 | — | — | — | — | — | 50 | 43 |
| Comparative Example 2 | 100 | 0.32 | 6250 | — | — | — | — | — | 100 | 20 |
| Comparative Example 3 | 75 | 0.25 | 6250 | — | — | — | — | — | 75 | 41 |
| Comparative Example 4 | 85 | 0.30 | 5250 | — | — | — | — | — | 85 | 38 |
| Comparative Example 5 | 0.3 | 0.40 | 5000 | — | — | — | — | — | 0.3 | 100 |
| Comparative Example 6 | 67 | 0.20 | 4550 | — | — | — | — | — | 67 | 42 |
| Comparative Example 7 | 72 | 0.40 | 3000 | 45 | 0.2 | 2000 | 10 | 1200 | 52 | 38 |
| Comparative Example 8 | 0.8 | 0.25 | 5500 | — | — | — | — | — | 0.8 | 100 |
| Comparative Example 9 | 106 | 0.30 | 3500 | — | — | — | 4 | 2000 | 71 | 21 |
| Comparative Example 10 | 65 | 0.40 | 5100 | — | — | — | — | — | 65 | 39 |
| Comparative Example 11 | 49 | 0.40 | 6350 | — | — | — | — | — | 49 | 41 |
| Comparative Example 12 | 93 | 0.30 | 5550 | — | — | — | — | — | 93 | 31 |
| Comparative Example 13 | 102 | 0.27 | 5000 | — | — | — | 30 | 2000 | 107 | 22 |
| Comparative Example 14 | 102 | 0.40 | 4000 | — | — | — | 1 | 1900 | 77 | 39 |

TABLE 2

| | Additive amount (g) | | | | Condition of drying before mixing | Mixing time (h) | Condition of drying after mixing |
|---|---|---|---|---|---|---|---|
| | $Na_2SO_4$ | $Na_2SO_3$ | $Na_2SeO_4$ | $Na_2SeO_3$ | | | |
| Example 1 | 180 | — | — | — | 80° C. for 8 hours | 3 | 70° C. for 8 hours |
| Example 2 | 215 | — | — | — | 80° C. for 6 hours | 4 | 80° C. for 16 hours |
| Example 3 | 35 | — | — | — | 140° C. for 3 hours | 2 | None |
| Example 4 | 700 | — | — | — | 80° C. for 3 hours | 5 | 80° C. for 16 hours |
| Example 5 | — | 625 | — | — | 100° C. for 8 hours | 8 | 70° C. for 24 hours |
| Example 6 | — | 625 | — | — | 80° C. for 12 hours | 3 | 70° C. for 24 hours |
| Example 7 | — | 25 | — | — | 80° C. for 5 hours | 10 | 70° C. for 24 hours |
| Example 8 | — | 950 | — | — | 120° C. for 1 hour | 12 | 100° C. for 24 hours |
| Example 9 | — | — | 55 | — | 80° C. for 15 hours | 4 | 100° C. for 8 hours |
| Example 10 | — | — | 468 | — | 80° C. for 10 hours | 8 | 100° C. for 8 hours |
| Example 11 | — | — | 936 | — | 60° C. for 5 hours | 10 | 80° C. for 16 hours |
| Example 12 | — | — | 1400 | — | 100° C. for 4 hours | 10 | 100° C. for 16 hours |
| Example 13 | — | — | — | 20 | 90° C. for 20 hours | 5 | 70° C. for 16 hours |
| Example 14 | — | — | — | 430 | 80° C. for 20 hours | 5 | 80° C. for 16 hours |
| Example 15 | — | — | — | 860 | 70° C. for 22 hours | 9 | 100° C. for 24 hours |
| Example 16 | — | — | — | 1300 | 100° C. for 10 hours | 18 | 100° C. for 24 hours |
| Example 17 | 200 | 80 | 50 | 40 | 80° C. for 24 hours | 9 | None |
| Comparative Example 1 | 180 | — | — | — | None | 3 | None |
| Comparative Example 2 | 180 | — | — | — | 70° C. for 4 hours | 3 | None |
| Comparative Example 3 | 180 | — | — | — | None | 1 | None |
| Comparative Example 4 | 700 | — | — | — | 60° C. for 8 hours | 3 | 50° C. for 24 hours |
| Comparative Example 5 | 1050 | — | — | — | None | 1 | None |
| Comparative Example 6 | — | 1300 | — | — | 40° C. for 1 hour | 1 | 40° C. for 24 hours |
| Comparative Example 7 | — | — | 280 | — | 80° C. for 15 hours | 4 | None |
| Comparative Example 8 | — | — | 936 | — | None | 8 | None |

TABLE 2-continued

|  | Additive amount (g) | | | | Condition of drying before mixing | Mixing time (h) | Condition of drying after mixing |
|---|---|---|---|---|---|---|---|
|  | $Na_2SO_4$ | $Na_2SO_3$ | $Na_2SeO_4$ | $Na_2SeO_3$ |  |  |  |
| Comparative Example 9 | — | — | 936 | — | 70° C. for 18 hours | 3 | None |
| Comparative Example 10 | — | — | 1875 | — | None | 10 | 60° C. for 3 hours |
| Comparative Example 11 | — | — | — | 215 | 90° C. for 20 hours | 5 | 70° C. for 16 hours |
| Comparative Example 12 | — | — | — | 850 | None | 9 | None |
| Comparative Example 13 | — | — | — | 1150 | 100° C. for 10 hours | 2 | 100° C. for 24 hours |
| Comparative Example 14 | 550 | — | 50 | 40 | None | 9 | 70° C. for 24 hours |

TABLE 3

|  | Sintering method | Sintering conditions | | | Composition of sintering body (at. %) | | |
|---|---|---|---|---|---|---|---|
|  |  | Temperature (° C.) | Pressure (MPa) | Holding time (h) | Na | Ga | Cu |
| Example 1 | HP | 500 | 50 | 2.0 | 2.3 | 39 | balance |
| Example 2 | HP | 800 | 10 | 2.0 | 3.0 | 26 | balance |
| Example 3 | HIP | 600 | 130 | 1.5 | 0.5 | 27 | balance |
| Example 4 | HP | 500 | 50 | 1.0 | 11.0 | 40 | balance |
| Example 5 | HIP | 700 | 100 | 1.0 | 11.1 | 29 | balance |
| Example 6 | HIP | 800 | 100 | 1.0 | 10.8 | 10 | balance |
| Example 7 | HP | 600 | 30 | 1.5 | 0.5 | 35 | balance |
| Example 8 | HP | 800 | 15 | 2.5 | 14.4 | 19 | balance |
| Example 9 | HP | 750 | 25 | 3.5 | 0.6 | 25 | balance |
| Example 10 | HP | 650 | 50 | 1.0 | 5.5 | 32 | balance |
| Example 11 | HP | 800 | 50 | 1.5 | 10.4 | 15 | balance |
| Example 12 | HIP | 700 | 90 | 2.5 | 14.5 | 31 | balance |
| Example 13 | HP | 500 | 35 | 5.0 | 0.3 | 40 | balance |
| Example 14 | HP | 800 | 50 | 5.0 | 4.9 | 11 | balance |
| Example 15 | HP | 750 | 45 | 2.0 | 10.2 | 25 | balance |
| Example 16 | HIP | 750 | 150 | 2.0 | 14.6 | 15 | balance |
| Example 17 | HP | 700 | 25 | 2.0 | 5.1 | 24 | balance |
| Comparative Example 1 | HP | 500 | 8 | 2.00 | 2.1 | 39 | balance |
| Comparative Example 2 | HIP | 700 | 150 | 1.00 | 2.1 | 32 | balance |
| Comparative Example 3 | HIP | 650 | 150 | 3.00 | 2.4 | 24 | balance |
| Comparative Example 4 | HIP | 700 | 100 | 1.00 | 9.7 | 29 | balance |
| Comparative Example 5 | HP | 600 | 30 | 1.50 | 17.5 | 32 | balance |
| Comparative Example 6 | HP | 800 | 15 | 2.50 | 26.0 | 20 | balance |
| Comparative Example 7 | HP | 550 | 25 | 3.50 | 3.0 | 25 | balance |
| Comparative Example 8 | HIP | 750 | 150 | 1.00 | 11.2 | 19 | balance |
| Comparative Example 9 | HP | 800 | 50 | 10.00 | 15.5 | 16 | balance |
| Comparative Example 10 | HIP | 700 | 90 | 2.50 | 20.1 | 33 | balance |
| Comparative Example 11 | HP | 500 | 15 | 5.00 | 2.3 | 40 | balance |
| Comparative Example 12 | HP | 750 | 45 | 2.00 | 9.9 | 26 | balance |
| Comparative Example 13 | HIP | 750 | 150 | 2.00 | 20.1 | 14 | balance |
| Comparative Example 14 | HP | 700 | 25 | 2.00 | 5.2 | 26 | balance |

Next, with respect to the sputtering target of each of the produced Examples 1 to 17 and Comparative Examples 1 to 14, the calculation results of the theoretical density ratio of the sintered body are shown in the column of "Theoretical density ratio (%)"; the results of three-point bending test at the rate of deformation of 0.5 mm/min with JIS R1601 being conformed are shown in the column of "Deflective strength (N/mm$^2$)"; the measurement results of the bulk specific resistance using a four probe method are shown in the column of "Bulk specific resistance (mΩ·cm)"; the target surface of an area of 100 cm² after machining is observed and the number of the specific Na compound aggregates having the size of 0.05 mm² is measured, and the calculation results of the average value per an area of 1 cm² of the area of 100 cm² are shown in the column of "Average number of Na compound aggregates"; the measurement results of the average grain size of the specific Na compound phase and the average grain size of the metallic phase are shown in the columns of "Average grain size of Na compound phase (μm)" and "Average crystal grain size of metallic phase (μm)", and each of the results is shown in Table 4. The sputtering target is left for 8 hours at a temperature of 25° C. and a humidity of 60%, and the checking results of the discoloration of the surface in visual check are shown in the column of "Occurrence of spots and discoloration" in Table 4.

Hereinafter, with respect to a theoretical density ratio, a deflective strength, an electric resistance (bulk specific resistance), an average grain size of the specific Na compound phase, and an average grain size of the metallic phase will be explained.

<Theoretical Density Ratio>

A measurement of the theoretical density ratio of the sputtering target is calculated from weight/size.

That is, with respect to the theoretical density ratio, since a density (theoretical density) of the basis material having no holes is changed by an actual ratio of Cu/Ga, kinds of incorporated raw materials, and sintering conditions, the density is calculated as follows.

First, a Cu—Ga metal mixture which has the same ratio to the ratio of Cu/Ga in the target material of the present embodiment is melted at 1200° C., then the above metal mixture is cast, the density of an ingot which is obtained by slow cooling, has the size of 10 cm×10 cm×10 cm, and has no defects is measured, and this is defined as the theoretical density of a Cu—Ga alloy having the above ratio.

Theoretical density of specific Na compounds, for example $Na_2SO_4$ is defined as 2.70 g/cm³, $Na_2SO_3$ is defined as 2.63 g/cm³, $Na_2SeO_3$ is defined as 3.10 g/cm³, $Na_2SeO_4$ is defined as 3.10 g/cm³. The theoretical density of the sputtering target is calculated by using: the above theoretical density of Cu—Ga alloy and theoretical density of the specific Na compounds; and the content of Cu and Ga and the content of the specific Na compounds in the sputtering target of the present embodiment.

Therefore, the theoretical density ratio is (target density)/(target theoretical density)×100%. Here, the target density is (weight)/(volume).

<Deflective Strength>

With respect to deflective strength, the sintered target material is machined so as to comply with JIS R1601, and the strength against bending (deflective strength) is measured. That is, the target material was machined in a shape of a rod, the size of which is 40 mm in length×4 mm in width×3 mm in thickness, and deflective strength was measured.

<Electrical Resistance>

The electrical resistance (bulk specific resistance) is measured by using a four probe method.

<Specific Na Compound Aggregates>

With respect to a measurement of the size of the specific Na compound aggregates, an area of 100 cm² on the target surface is observed by an optical microscope using 10 times of a magnification and is photographed (for example, refer to FIG. 1). Based on this picture, the size of the aggregates is calculated, and the number of the specific Na compound aggregates having the size of 0.05 mm² or more is counted. Furthermore, a check of whether the aggregates are the specific Na compounds is performed by using EDX function of SEM. In addition, the average number of the specific Na compound aggregates having the size of 0.05 mm² or more, which are present in an area of 1 cm² of the target surface, is calculated by using the average in an area of 100 cm² of the target surface. Since the specific Na compounds easily dissolve in water, the target surface for observation is machined by a dry machining.

<Average Grain Size of Specific Na Compound Phase>

Next, with respect to the average grain size of the specific Na compound phase in the target basis material, in order to conduct a measurement thereof, samples for observation are produced as follows, and the grain size thereof is calculated.

First, an arbitrary part of the sintered sputtering target is cut, and a sample having a block shape and having the size of substantially 5×10×3 mm is produced. Next, the sample is polished by a dry polishing to have a surface roughness Ra of 0.5 μm or less, and a surface for observation is produced. Furthermore, the observation surface is photographed by 100 times of a magnification of SEM, a cross-section area of the specific Na compound phase in an observation area of 1000 μm×1000 μm is calculated, and after converting to a circle-equivalent diameter of a projected area, the average grain size of the grains in the observation area is calculated.

<Average Grain Size of Metallic Phase>

A production method of the sample for the observation in order for measuring the average grain size of the metallic phase and a calculation of the average grain size thereof are as follows.

First, the observation surface of the sample having a block shape is etched by dipping for 5 seconds in an etchant which was prepared by pure water of 50 ml, a hydrogen peroxide solution of 5 ml and aqueous ammonia of 45 ml.

Next, an alloy composition is photographed by observing an etching surface using 250 times of a magnification of the optical microscope. At this time, a cross-sectional area of crystals in the observation area of 500 μm×1000 μm is calculated and is converted to a circle-equivalent diameter of a projected area, and then, the average grain size of the grains in the observation area is calculated.

TABLE 4

|  | Theoretical density ratio (%) | Deflective strength (N/mm²) | Bulk specific resistance (mΩ*cm) | Average grain size of Na compound phase (μm) | Average number of Na compound aggregates | Average crystal grain size of metallic phase (μm) | Occurrence of spots and discoloration |
|---|---|---|---|---|---|---|---|
| Example 1 | 91 | 276 | <0.1 | 3.1 | <0.1 | 5 | None |
| Example 2 | 96 | 400 | <0.1 | 2.2 | <0.1 | 12 | None |

TABLE 4-continued

| | Theoretical density ratio (%) | Deflective strength (N/mm$^2$) | Bulk specific resistance (mΩ*cm) | Average grain size of Na compound phase (μm) | Average number of Na compound aggregates | Average crystal grain size of metallic phase (μm) | Occurrence of spots and discoloration |
|---|---|---|---|---|---|---|---|
| Example 3 | 99 | 432 | <0.1 | 1.7 | <0.1 | 9 | None |
| Example 4 | 94 | 155 | 0.1 | 3.5 | <0.1 | 8 | None |
| Example 5 | 94 | 310 | 0.1 | 3.4 | <0.1 | 7 | None |
| Example 6 | 97 | 450 | 0.1 | 4.5 | 0.2 | 6 | None |
| Example 7 | 95 | 210 | 0.2 | 3.5 | 0.2 | 11 | None |
| Example 8 | 94 | 217 | 0.4 | 9.4 | 0.4 | 14 | None |
| Example 9 | 97 | 496 | <0.1 | 2.9 | <0.1 | 11 | None |
| Example 10 | 97 | 330 | <0.1 | 2.5 | <0.1 | 14 | None |
| Example 11 | 95 | 207 | <0.1 | 4.2 | <0.1 | 5 | None |
| Example 12 | 90 | 122 | 0.5 | 9.0 | 0.7 | 8 | None |
| Example 13 | 96 | 163 | <0.1 | 2.0 | <0.1 | 15 | None |
| Example 14 | 95 | 493 | <0.1 | 3.4 | <0.1 | 14 | None |
| Example 15 | 93 | 231 | 0.2 | 9.3 | 0.6 | 15 | None |
| Example 16 | 90 | 109 | 0.5 | 9.9 | 0.8 | 20 | None |
| Example 17 | 97 | 394 | <0.1 | 3.3 | <0.1 | 7 | None |
| Comparative Example 1 | 82 | 78 | <0.1 | 6.6 | 1.2 | 4 | Present |
| Comparative Example 2 | 93 | 278 | <0.1 | 6.1 | 1.5 | 3 | Present |
| Comparative Example 3 | 91 | 99 | <0.1 | 13.6 | 1.8 | 26 | Present |
| Comparative Example 4 | 93 | 255 | 0.2 | 5.5 | 1.1 | 8 | Present |
| Comparative Example 5 | 84 | 78 | 0.1 | 13.3 | 2.1 | 1 | Present |
| Comparative Example 6 | 90 | 99 | 0.6 | 17.3 | 3.9 | 15 | Present |
| Comparative Example 7 | 82 | 91 | <0.1 | 3.2 | 1.1 | 4 | Present |
| Comparative Example 8 | 89 | 92 | 0.2 | 4.5 | 1.3 | 5 | Present |
| Comparative Example 9 | 96 | 170 | 0.1 | 5.0 | 1.9 | 29 | Present |
| Comparative Example 10 | 93 | 102 | 0.5 | 6.1 | 5 | 8 | Present |
| Comparative Example 11 | 82 | 179 | <0.1 | 5.6 | 0.3 | 11 | Present |
| Comparative Example 12 | 90 | 93 | 0.3 | 3.3 | 1.7 | 12 | Present |
| Comparative Example 13 | 85 | 78 | 0.6 | 4.9 | 1.6 | 18 | Present |
| Comparative Example 14 | 90 | 110 | <0.1 | 4.7 | 1.5 | 9 | Present |

Furthermore, the sputtering targets of the produced Examples 1 to 17 and Comparative Examples 1 to 14 were set in a magnetron sputtering apparatus, a film having 1000 nm was deposited on a silicon substrate with an oxide film by an input power of a pulsed DC sputtering of 8 W/cm$^2$. Also, at this time, Ar pressure during sputtering was set to 1.3 Pa, the distance between the target and the substrate was set to 70 mm. In addition, heating of the substrate was not performed at the time of deposition. Moreover, in the above conditions, continuous sputtering for 10 minutes was carried out, and the number of occurrences of micro-arc abnormal discharge was automatically recorded by an arcing counter provided in the sputtering power source. Also, the number of occurrences of significant abnormal discharge was visually checked. Furthermore, a check of whether there is a trace of a significant abnormal discharge such as melting, cavity, chipping on the target surface after sputtering was carried out. These results are shown in the columns of "Continuous discharging time (minutes)", "Target surface condition after continuous discharge", "The number of times of micro-arc abnormal discharge", and "The number of times of significant abnormal discharge" in Table 5. In addition, in the case of the Comparative examples, since the phenomenon in which a significant abnormal discharge occurs, plasma is lost, and sputtering cannot be performed occurs, the time elapsed until plasma loss or stop of sputtering was defined as the time of continuous sputtering.

The thin film obtained by the above deposition was peeled off from the substrate, and the quantitative measure of Na and Ga was carried out by using the ICP method. The results thereof are shown in the column of "Composition of film (at. %)" in Table 5.

TABLE 5

| | Cracks and Chips during machining | Continuous discharge time (min) | Target surface condition after continuous discharge | The number of times of micro-arc abnormal discharge | The number of times of significant abnormal discharge | Composition of film (at. %) | | |
|---|---|---|---|---|---|---|---|---|
| | | | | | | Na | Ga | Cu |
| Example 1 | None | 10 | Good | 5 | 0 | 2.0 | 41 | balance |
| Example 2 | None | 10 | Good | 1 | 0 | 2.7 | 27 | balance |
| Example 3 | None | 10 | Good | 1 | 0 | 0.3 | 27 | balance |
| Example 4 | None | 10 | Good | 5 | 0 | 8.2 | 39 | balance |
| Example 5 | None | 10 | Good | 5 | 0 | 9.1 | 25 | balance |
| Example 6 | None | 10 | Good | 66 | 0 | 8.8 | 10 | balance |
| Example 7 | None | 10 | Good | 2 | 0 | 0.3 | 34 | balance |
| Example 8 | None | 10 | Good | 177 | 0 | 11.8 | 20 | balance |
| Example 9 | None | 10 | Good | 2 | 0 | 0.5 | 25 | balance |
| Example 10 | None | 10 | Good | 1 | 0 | 3.9 | 33 | balance |
| Example 11 | None | 10 | Good | 284 | 0 | 8.2 | 18 | balance |
| Example 12 | None | 10 | Good | 246 | 0 | 11.1 | 30 | balance |
| Example 13 | None | 10 | Good | 3 | 0 | 0.2 | 40 | balance |
| Example 14 | None | 10 | Good | 2 | 0 | 4.1 | 11 | balance |
| Example 15 | None | 10 | Good | 204 | 0 | 6.9 | 24 | balance |
| Example 16 | None | 10 | Good | 257 | 0 | 10.2 | 15 | balance |
| Example 17 | None | 10 | Good | 0 | 0 | 3.8 | 26 | balance |
| Comparative Example 1 | Present | 2 | Significant discharge trace | 2030 | 2 | 1.7 | 39 | balance |
| Comparative Example 2 | None | 2 | Significant discharge trace | 1494 | 0 | 1.8 | 27 | balance |
| Comparative Example 3 | Present | 1 | Significant discharge trace | 1768 | 2 | 1.9 | 25 | balance |
| Comparative Example 4 | None | 4 | Significant discharge trace | 496 | 1 | 8.2 | 29 | balance |
| Comparative Example 5 | Present | 3 | Significant discharge trace | 3364 | 4 | 14.3 | 31 | balance |
| Comparative Example 6 | Present | 2 | Significant discharge trace | 43204 | 10 | 17.1 | 23 | balance |
| Comparative Example 7 | None | 10 | Significant discharge trace | 332 | 0 | 1.9 | 24 | balance |
| Comparative Example 8 | None | 8 | Significant discharge trace | 474 | 0 | 6.8 | 22 | balance |
| Comparative Example 9 | None | 5 | Significant discharge trace | 778 | 1 | 11.0 | 15 | balance |
| Comparative Example 10 | Present | 2 | Significant discharge trace | 5920 | 2 | 15.8 | 33 | balance |
| Comparative Example 11 | None | 10 | a small amount of discharge trace | 397 | 0 | 2.0 | 40 | balance |
| Comparative Example 12 | Present | 5 | Significant discharge trace | 829 | 1 | 7.7 | 26 | balance |
| Comparative Example 13 | Present | 7 | Significant discharge trace | 994 | 1 | 15.0 | 16 | balance |
| Comparative Example 14 | None | 8 | Significant discharge trace | 976 | 3 | 4.3 | 24 | balance |

As can be seen from these evaluation results, any development of spots and discoloration did not occur and there was no surface discoloration in the sputtering targets of the Examples 1 to 17 as shown in Table 4; whereas, spots or discoloration occurred in every sputtering target of the Comparative Examples 1 to 14 as shown in Table 4.

Moreover, in the sputtering targets of the Examples 1 to 17, as shown in Table 5, cracks and chips during cutting, and chips on the surface were not occurred; whereas, in the sputtering targets of the Comparative Examples 1, 3, 5, 6, 10, 12, and 13, as shown in Table 5, cracks and chips during cutting were occurred by reason of omitting a drying treatment or drying insufficiently in the step that is before the preparation of the mixed powder and further in the step that is after preparation thereof.

Also, as shown in Table 5, every sputtering target of the Examples 1 to 17 could carry out continuous discharge and furthermore the condition of the target surface after the continuous discharge was good, and the number of times of the micro-arc abnormal discharge during sputtering was less than 300 in every Examples; whereas, every sputtering target of the Comparative Examples 1 to 14 was short in the continuous discharge time and a significant discharge trace appeared on the target surface after the continuous discharge, the number of times of the micro-arc abnormal discharge thereof exceeded 300 and frequently occurred, and therefore, a stable DC sputtering could not be carried out.

Furthermore, in the sputtering targets of the Examples 1 to 17, as shown in Table 5, the number of times of the significant abnormal discharge during sputtering was 0; whereas, in the Comparative Examples 1, 3 to 6, 9 to 12, 13 and 14, the number of times thereof was 1 or more and frequently occurred. On the other hand, in the Comparative Examples 2, 7, 8 and 11, the number of times of the significant abnormal discharge during sputtering was 0; however, a discharge trace appeared on the target surface after the continuous discharge, and the number of times of the micro-arc abnormal discharge thereof exceeded 300 and frequently occurred, and therefore, a stable DC sputtering could not carried out.

Figure 2:
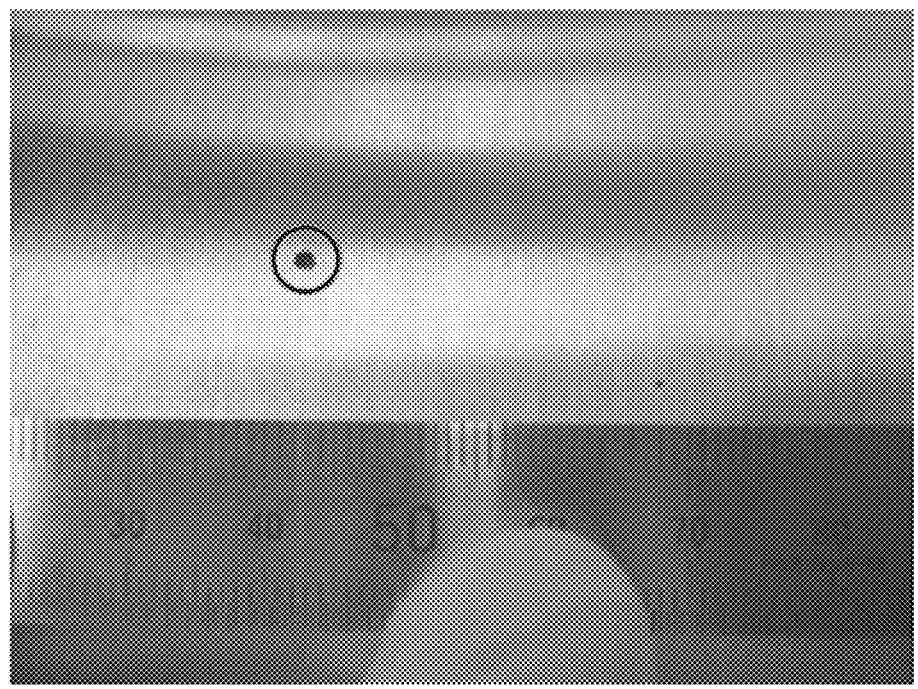
FIG. 2 is a picture of a light microscope showing aggregates of a target surface in the sputtering target of a Comparative Example.
Figure 3:
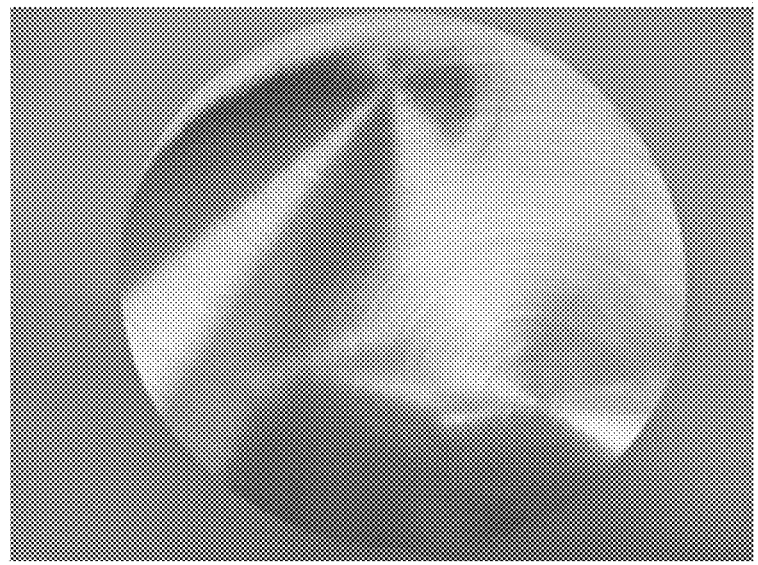
FIG. 3 is a picture showing a target surface in the evaluation of the surface discoloration in the sputtering target of the Example.
Figure 4:
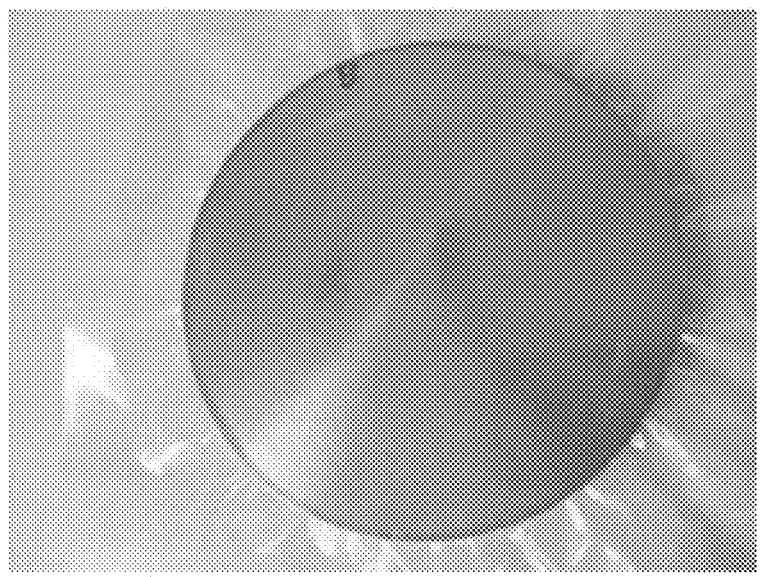
FIG. 4 is a picture showing a target surface in the evaluation of the surface discoloration in the sputtering target of the Comparative Example.
Figure 5:
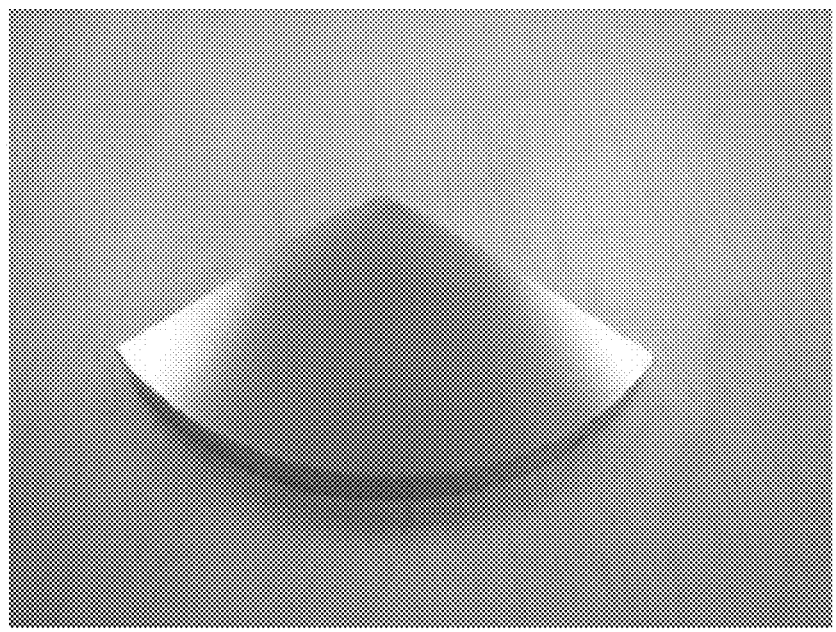
FIG. 5 is a picture showing the presence or absence of chipping of a target surface after machining in the sputtering target of the Example.
Figure 6:
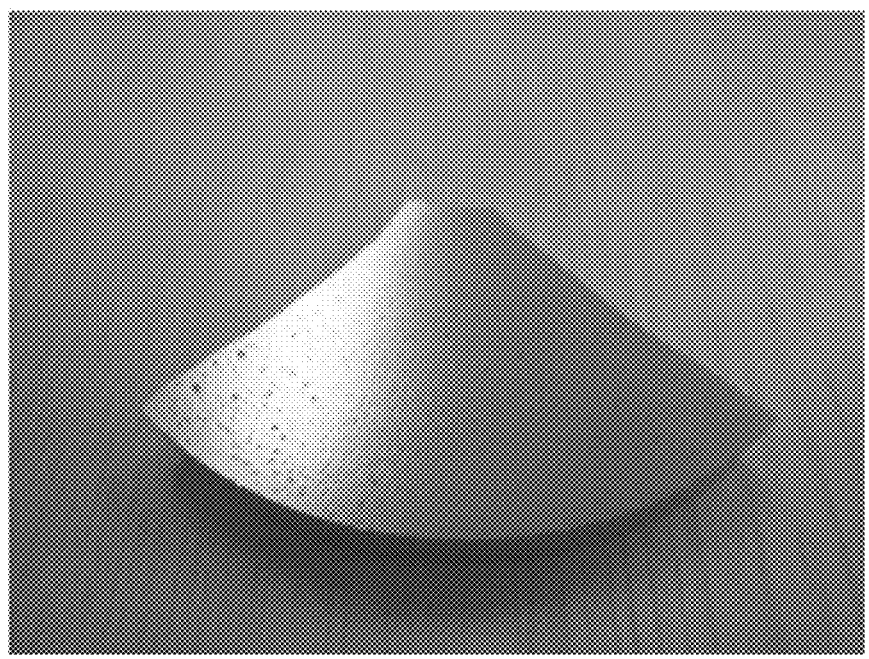
FIG. 6 is a picture showing the presence or absence of chipping of a target surface after machining in the sputtering target of the Comparative Example.

In addition, in the case of the Example 1 of the present invention, one example of aggregates having the size of 0.05 mm² or less (black spot in the circle mark) was shown in a picture of FIG. 1; and in the case of the Comparative Example 1, one example of aggregates having the size of 0.05 mm² or more (black portion in the circle mark) was shown in a picture of FIG. 2. Moreover, the case of the Example 1 in which spots and discoloration were not occurred was shown in a picture of a target surface of FIG. 3; and the case of the Comparative Example 1 in which spots and discoloration were occurred was shown in a picture of a target surface of FIG. 4. Furthermore, the case of the Example 1 in which chips were not generated during machining was shown in a picture of FIG. 5; and the case of the Comparative Example 1 in which chips were generated was shown in FIG. 6.

In addition, in order to use the present invention as a sputtering target, the sputtering target is preferable to have a surface roughness of 5 µm or less, and metallic impurity concentration of 0.1 at. % or less. Every example described above has satisfied these conditions.

According to the above, since the sputtering target of the present embodiment has the theoretical density ratio of 90% or more, the deflective strength of 100 N/mm² or more, the bulk specific resistance of 1 mΩ·cm or less, and the average number of the specific Na compound aggregates that have the size of 0.05 mm² or more within an area of 1 cm² of the target surface being one or less, a sputtering target in which the occurrence of discoloration, spots, and abnormal discharge is suppressed by sufficiently securing the density of the target material, securing the deflective strength and electrical conductivity, and suppressing the generation of the above aggregates even though the sputtering target contains Na can be obtained, and the sputtering target which has a high strength and is hard to crack can be obtained.

In the sputtering target of the present embodiment, the average grain size of the specific Na compounds is formed to 10 µm or less; and thereby, it is possible to carry out a stable DC sputtering or pulse DC sputtering by suppressing the abnormal discharge caused by the specific Na compounds. Furthermore, since the average grain size of the metallic phase in the sputtering target basis material is 20 µm or less, the toughness of the sputtering target can be satisfactory maintained even if the theoretical density ratio of the target material is 90% or more and a high concentration of the specific Na compounds is contained therein.

Also, in the production method of the sputtering target of the present embodiment, since the average particle size of the Cu—Ga powder is 1 to 45 µm and moreover the particle having the particle size of 30 µm or less is account for 50 wt. % or more compared to the total powder weight of the Cu—Ga powder, it is possible to produce a target in which the reduction of mechanical strength and electrical conductivity is suppressed and the occurrence of discoloration is suppressed.

Furthermore, since the method has the step of drying the specific Na compound powder at a temperature of 70° C. or more before the step of mixing in which the mixed powder is obtained, and furthermore as necessary, the method has the step of drying the mixed powder, which was obtained in the step of mixing, at a temperature of 70° C. or more, the dispersion properties of the grains of the specific Na compounds are maintained, and the re-aggregation after mixing the raw material powders can be suppressed.

The technical scope of the present invention is not limited to the above described embodiment and the above examples, but it can include various changes within the scope of the invention without departing from the spirit thereof.

FIELD OF INDUSTRIAL APPLICATION

According to the sputtering target related to the present invention and a production method thereof, Na is contained in a form of the specific Na compounds, the theoretical density ratio of the target material is 90% or more, the deflective strength thereof is 100 N/mm² or more, the bulk resistivity thereof is 1 mΩ·cm or less, and the average number of the specific Na compound aggregates having the size of 0.05 mm² or more within an area of 1 cm² of the target surface is one or less. Therefore, the discoloration caused by moisture absorption and abnormal discharge are suppressed along with Na being contained in the sputtering target, and furthermore, the sputtering target has a high strength and is hard to crack. Thus, the deposition of a light absorbing layer of a CIGS thin-film type solar battery by the sputtering method that uses the sputtering target of the present invention can achieve the addition of Na to the light absorbing layer along with providing a high mass-productivity and can produce a solar battery having high power generation efficiency.

What is claimed is:

1. A sputtering target having a sintered body having a component composition consisting of:
   Ga, Na compounds, Cu, and inevitable impurities,
   wherein the Ga is in the range of 10 to 40 at. %,
   Na of the Na compounds is in the range of 0.1 to 15 at. %, and
   the balance is Cu and inevitable impurities,
   wherein the Na compounds include at least one compound selected from the group consisting of sodium sulfate, sodium sulfite, sodium selenate, and sodium selenite, and
   wherein the sintered body has a composition in which a Na compound phase is dispersed,
   wherein an average grain size of the Na compound phase is 10.0 µm or less, and
   wherein, in the sintered body, the average number of aggregates of the Na compounds having the size of 0.05 mm² or more within an area of 1 cm² of a surface of the sputtering target is one or less.

2. The sputtering target according to claim 1, wherein the sintered body has a theoretical density ratio of 90% or more,
   a deflective strength of 100 N/mm² or more, and
   a bulk resistivity of 1 mΩ·cm or less.

3. The sputtering target according to claim 1, wherein a metallic phase in the sintered body has an average crystal grain size of 20 µm or less.

4. A production method of the sputtering target according to claim 1 comprising the steps of:
   preparing a mixed powder in which a Na compound powder and a Cu—Ga powder are mixed, the Na compound powder consisting of at least one compound selected from the group consisting of sodium sulfate, sodium sulfite, sodium selenate, and sodium selenite; and
   producing a sintered body by sintering the mixed powder,
   wherein the Cu—Ga powder consists of a Cu—Ga alloy powder or consists of a Cu—Ga alloy powder and a Cu powder,
   the average particle size thereof is 1 to 45 µm, and the particle having the particle size of 30 μm or less is account for 50 wt. % or more compared to the total powder weight of the Cu—Ga powder.

5. The production method according to claim 4 further comprising the step of:
   drying the Na compound powder at a temperature of 70° C. or more before the step of preparing the mixed powder.

6. The production method according to claim 4 further comprising the step of:
   drying the mixed powder at a temperature of 70° C. or more after the step of preparing the mixed powder.

7. The production method according to claim 4, wherein the step of sintering the mixed powder performs sintering of the mixed powder in a non-oxidizing atmosphere or vacuum.

* * * * *